(12) United States Patent
Crobu et al.

(10) Patent No.: US 9,401,349 B2
(45) Date of Patent: Jul. 26, 2016

(54) STACK OF INTEGRATED-CIRCUIT CHIPS AND ELECTRONIC DEVICE

(71) Applicants: STMicroelectronics (Grenoble 2) SAS, Grenoble (FR); STMicroelectronics (Malta) Ltd, Kirkop (MT); STMicroelectronics S.r.l., Agrate Brianza (IT)

(72) Inventors: Angelo Crobu, San Donato Milanese (IT); Kenneth Fonk, San Gwann (MT); Romain Coffy, Voiron (FR)

(73) Assignees: STMICROELECTRONICS (GRENOBLE 2) SAS, Grenoble (FR); STMICROELECTRONICS (MALTA) LTD, Kirkop (MT); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/723,893

(22) Filed: May 28, 2015

(65) Prior Publication Data
US 2015/0364455 A1    Dec. 17, 2015

(30) Foreign Application Priority Data
Jun. 12, 2014    (FR) ...................................... 1455350

(51) Int. Cl.
*G01P 15/08*    (2006.01)
*H01L 25/18*    (2006.01)
(Continued)

(52) U.S. Cl.
CPC .............. *H01L 25/18* (2013.01); *G01L 19/147* (2013.01); *G01L 19/148* (2013.01); *H01L 23/24* (2013.01); *H01L 23/3157* (2013.01); *H01L 24/10* (2013.01); *H01L 24/33* (2013.01); *H01L 24/49* (2013.01); *H01L 24/73* (2013.01); *H01L 25/0657* (2013.01); *H01L 24/13* (2013.01); *H01L 24/16* (2013.01); *H01L 24/48* (2013.01); *H01L 2224/10135* (2013.01);
(Continued)

(58) Field of Classification Search
CPC ..... H01L 25/18; H01L 24/73; H01L 23/3157; H01L 24/33; H01L 24/49; H01L 23/24; H01L 24/10; H01L 25/0657; H01L 2924/146; H01L 2224/48225; H01L 2924/14; H01L 2224/48106; H01L 2224/32225; H01L 2224/33181; H01L 2224/73265; H01L 2224/26122; H01L 2224/32145; H01L 2224/48227; H01L 2224/48145; H01L 24/13; H01L 2225/06575; H01L 2224/73257; H01L 2924/00; G01L 19/147; G01L 19/148
See application file for complete search history.

(56) References Cited

U.S. PATENT DOCUMENTS 6,593,662 B1    7/2003 Pu et al.
7,749,797 B2    7/2010 Bauer et al.
(Continued)

FOREIGN PATENT DOCUMENTS

JP    2007180201 A    7/2007

OTHER PUBLICATIONS

INPI Search Report and Written Opinion for FR 1455350 dated Jul. 30, 2014 (9 pages).

*Primary Examiner* — Victor A Mandala
(74) *Attorney, Agent, or Firm* — Gardere Wynne Sewell LLP

(57) ABSTRACT

A stack of chips is formed by a first integrated-circuit chip and a second integrated-circuit chip. The chips have opposing faces which are separated from each other by an interposed spacer. The spacer is fastened by adhesion to only one of the opposing faces. The opposing faces are fastened to each other by a local adhesive which is separate from spacer.

20 Claims, 2 Drawing Sheets

(51) Int. Cl.
*G01L 19/14* (2006.01)
*H01L 23/24* (2006.01)
*H01L 23/00* (2006.01)
*H01L 25/065* (2006.01)
*H01L 23/31* (2006.01)

(52) U.S. Cl.
CPC ......... *H01L 2224/10165* (2013.01); *H01L 2224/1319* (2013.01); *H01L 2224/16145* (2013.01); *H01L 2224/26122* (2013.01); *H01L 2224/32145* (2013.01); *H01L 2224/32225* (2013.01); *H01L 2224/33181* (2013.01); *H01L 2224/48106* (2013.01); *H01L 2224/48145* (2013.01); *H01L 2224/48225* (2013.01); *H01L 2224/48227* (2013.01); *H01L 2224/49175* (2013.01); *H01L 2224/73207* (2013.01); *H01L 2224/73257* (2013.01); *H01L 2224/73265* (2013.01); *H01L 2225/0651* (2013.01); *H01L 2225/06506* (2013.01); *H01L 2225/06568* (2013.01); *H01L 2225/06575* (2013.01); *H01L 2924/14* (2013.01); *H01L 2924/146* (2013.01); *H01L 2924/16151* (2013.01)

(56) References Cited

U.S. PATENT DOCUMENTS

| | | |
|---|---|---|
| 2003/0006508 A1 | 1/2003 | Ikezawa et al. |
| 2003/0038374 A1* | 2/2003 | Shim .............. H01L 23/3128 257/777 |
| 2003/0160312 A1* | 8/2003 | Lo .................. H01L 25/0657 257/678 |
| 2003/0189259 A1 | 10/2003 | Kurita et al. |
| 2005/0257615 A1 | 11/2005 | Ohta |
| 2006/0202319 A1* | 9/2006 | Swee Seng ....... H01L 23/3128 257/686 |
| 2011/0127670 A1* | 6/2011 | Perng ............... H01L 25/50 257/738 |
| 2013/0214368 A1 | 8/2013 | Fonk et al. |

\* cited by examiner

STACK OF INTEGRATED-CIRCUIT CHIPS AND ELECTRONIC DEVICE

PRIORITY CLAIM

This application claims priority from French Application for Patent No. 1455350 filed Jun. 12, 2014, the disclosure of which is incorporated by reference.

TECHNICAL FIELD

The present invention relates to the field of microelectronics.

BACKGROUND

In order to fasten stacked integrated-circuit chips to one another, it is known to provide a layer of adhesive or regions of adhesive in the space between those integrated-circuit chips in order to form a rigid fastening.

SUMMARY

A stack is provided which comprises a first and a second integrated-circuit chip, having opposing faces located at a distance from one another; a spacer interposed between the peripheral region of the face of the second chip, over at least a part of this region, and the face of the first chip, and fastened by adhesion to only one of these faces; and a local adhesive fastening means interposed between the central region of the face of the second chip and the face of the first chip in order to fasten the chips to one another.

The fastening means and the spacer may be at a distance from one another.

The spacer may form at least one vent.

The spacer may comprise a spacing ring.

The spacing ring may comprise at least one groove forming a vent.

The spacer may comprise an open spacing ring.

The spacer may comprise a plurality of pillars separated from one another, each pillar being able to be fastened by adhesion to only one of the faces.

The fastening means may comprise at least one drop of adhesive.

The second chip may comprise a pressure sensor.

An electronic device is also provided, which comprises a stack and which comprises an encapsulation package having at least one through-opening.

The encapsulation package may be partially filled with a gel.

BRIEF DESCRIPTION OF THE DRAWINGS

Stacks according to the invention will now be described by way of non-limiting examples, illustrated by the drawing in which.

DETAILED DESCRIPTION OF THE DRAWINGS

Figure 1:
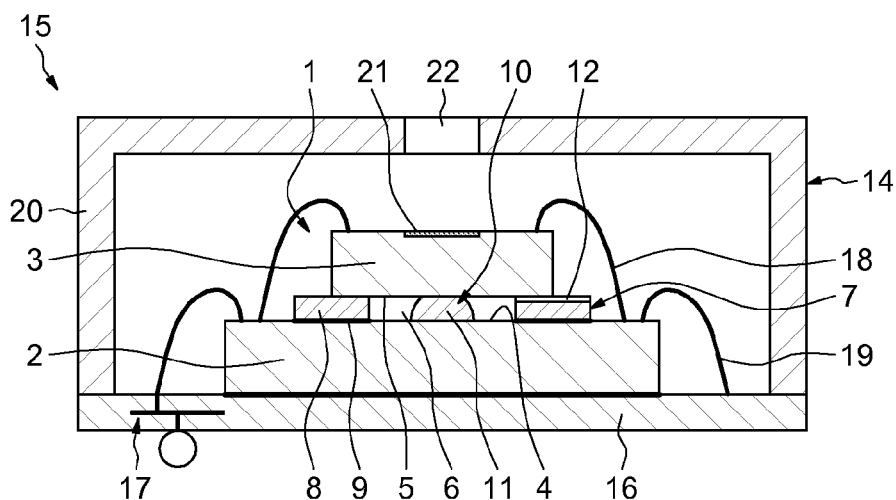
FIG. 1 represents a section of a stack in a package.
Figure 2:
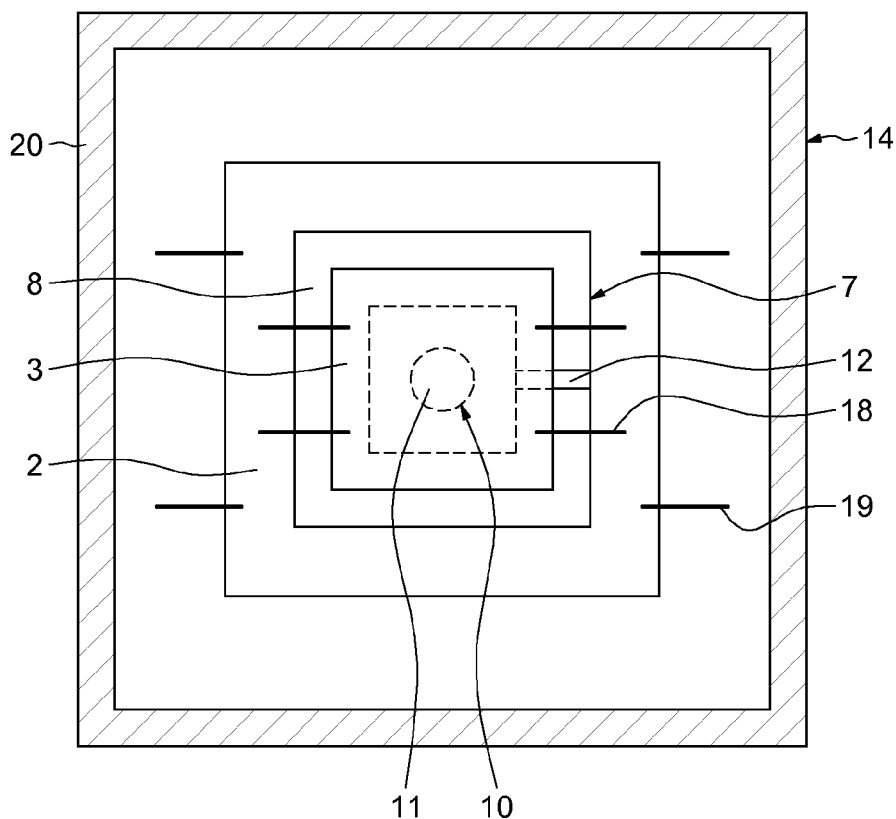
FIG. 2 represents a plan view of the stack, the package being in section.

As illustrated in FIGS. 1 and 2, a stack 1 comprises a first integrated-circuit chip 2 and a second integrated-circuit chip 3, which have opposing faces 4 and 5 located at a distance from one another and parallel to one another, so that there is a space 6 between them.

The face 4 of the chip 2 is larger than the face 5 of the chip 3, and it extends fully opposite the face 5.

The stack 1 comprises a spacer 7, which is interposed between the face 4 of the first chip 2 and the peripheral region of the face 5 of the second chip 3.

According to this example, the spacer 7 comprises a spacing ring 8 which is fastened only on the face 4 of the first chip by means of a layer of adhesive 9, and which is not fastened on the face 5 of the second chip 3. The spacing ring 8 may be formed from a substrate of glass fiber and resin.

The stack 1 furthermore comprises a local adhesive fastening means 10 interposed between the central region of the face 5 of the second chip 3 and the face 4 of the first chip 3, in order to fasten the chips to one another. This local adhesive fastening means 10 may comprise a drop of cured adhesive 11 separated from the spacing ring 8, for example a drop of epoxy adhesive with a relatively low Young's modulus adhering to the face 4 of the first chip 3 and to the face 5 of the second chip 3.

In order to manufacture the stack 1, the spacing ring 8 is fastened on the face 4 of the first chip 2, a drop of liquid adhesive 11 is deposited inside and at a distance from the spacing ring 8, then the second chip 3 is placed above the spacing ring 8 so as to compress the drop of adhesive 11.

After curing of the drop of adhesive 11, the chips 2 and 3 are locally fastened to one another only by this drop of adhesive 11, and they are prevented from tilting with respect to one another by the presence of the spacing ring 8.

Furthermore, the local drop of fastening adhesive 11 induces little in the way of mechanical stresses between the chips 2 and 3, and in the event of expansion or contraction of the chips 2 and 3 due to temperature variations, the chip 2 can slide on the spacing ring 8 fixed to the chip 2.

According to one alternative embodiment, the spacing ring 8 could have at least one groove 12 in its face turned toward the chip 3. According to another alternative embodiment, this groove 12 could be a through-groove, the spacing ring 8 then being open. The groove 12 forms a vent for the space delimited by the chips 2 and 3 and the spacing ring 8.

Figure 3:
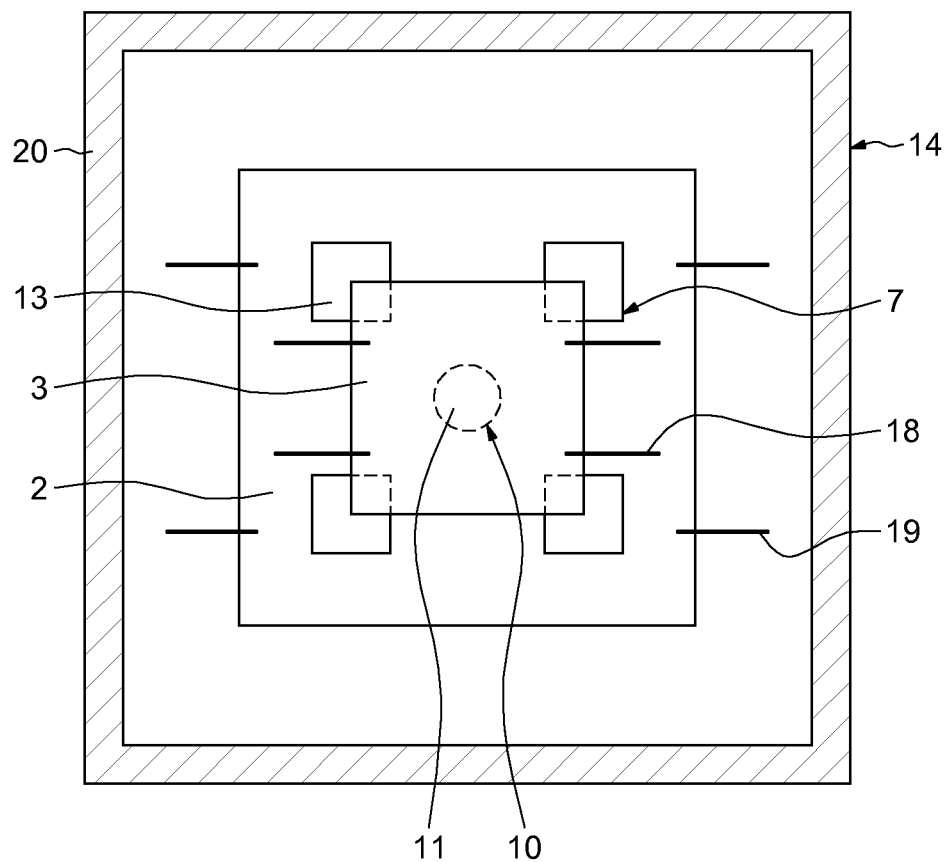
FIG. 3 represents a plan view of another stack.

According to another alternative embodiment, which is illustrated in FIG. 3, the spacer 7 comprises separated pillars 13, for example four, interposed between the four corners of the peripheral region of the face 5 of the chip 3 and the chip 2. The spaces between the pillars 13 form vents. As before, these pillars 13 are adhesively bonded only on the face 4 of the chip 2.

According to another alternative embodiment, instead of being adhesively bonded on the face 4 of the chip 2, the spacing ring 8 or the pillars 13 could be adhesively bonded against the face 5 of the second chip 3, without being attached to the face 4 of the chip 2.

As illustrated in FIGS. 1 and 2, the stack 1 is arranged inside an encapsulation package 14, so as to constitute an electronic device 15.

The package 14 comprises a support plate 16, on which the face of the chip 2 on the other side from its face 4 is fastened by a layer of adhesive 16. This support plate 16 comprises through-means for electrical connection 17 with a view to external electrical connection of the stack 1.

The chip 3 is connected to the chip 2 by electrical connection wires 18, and the chip 2 is connected to the electrical connection means 17 by electrical connection wires 19.

The package 14 furthermore comprises a cap 20, which covers at a distance the stack 1 and the electrical connection wires 18 and 19, and the edge of which is fastened on the periphery of the support plate 16.

According to one exemplary embodiment, the chip 3 may include a pressure sensor 21 in its front face on the other side from its face 5, and the chip 2 may include means for processing the signals coming from the pressure sensor 21.

The cap 20 may have a through-hole 22 located for example in front of the pressure sensor 21, so that the pressure sensor 21 is subjected to the pressure outside the package 14 through this hole 22.

Furthermore, according to one alternative embodiment, the package may be partially filled with an encapsulation gel, in which the chip 3 and the wires 18 and 19 are embedded so that they are protected in particular against oxidation. It is desirable that this gel does not reach the front wall of the package 14, through which the hole 22 is formed.

According to one alternative embodiment, the gel could be introduced into the package 14 through the hole 22. According to one alternative embodiment, the package 14 could comprise a peripheral wall and a cover comprising the hole 22. In this case, this peripheral wall would first be fitted, then the gel would be introduced into the space delimited by this peripheral wall, then the cover would be fitted on the peripheral wall, without the cover coming in contact with the surface of the gel.

The result of what has been described above is that the mechanical stresses that the chip 3 experiences can be very limited or even non-existent, which is highly advantageous when this chip 3 includes a pressure sensor 21.

The present invention is not limited to the example described above. Alternative embodiments are possible without departing from the scope of the invention.

What is claimed is:

1. A stack of integrated-circuit chips, comprising:
a first and a second integrated-circuit chip having opposing first and second faces, respectively, located at a distance from one another;
a spacer interposed between a part of a peripheral region of the second face of the second chip and the first face of the first chip, the spacer being vertically aligned with the first face of the first chip and the part of the peripheral region of the second face of the second chip;
a first adhesive attaching the spacer only to one of the first and second faces; and
a second adhesive interposed between a central region of the second face of the second chip and the first face of the first chip in order to fasten the first and second integrated-circuit chips to one another;
wherein the second adhesive is separated from and not in contact with the spacer.

2. The stack according to claim 1, further comprising electrical connection wires connected between the first and second chips.

3. The stack according to claim 1, wherein the spacer forms at least one vent from said central region.

4. The stack according to claim 1, wherein the spacer comprises a spacing ring.

5. The stack according to claim 4, wherein the spacing ring comprises at least one groove forming a vent from said central region.

6. The stack according to claim 1, wherein the spacer comprises an open spacing ring.

7. The stack according to claim 1, wherein the spacer comprises a plurality of pillars separated from one another, each pillar being fastened by said first adhesive to only one of the first and second faces.

8. The stack according to claim 1, wherein the second adhesive comprises at least one drop of adhesive material.

9. The stack according to claim 1, wherein the second integrated-circuit chip comprises a pressure sensor.

10. The stack according to claim 1, further comprising an encapsulation package having at least one through-opening.

11. The stack according to claim 10, wherein the encapsulation package is at least partially filled with a gel.

12. An apparatus, comprising:
a first integrated-circuit chip having a top surface;
a second integrated-circuit chip having a bottom surface;
wherein the top surface faces the bottom surface;
a spacer positioned between the top surface and the bottom surface, the spacer being vertically aligned with the top surface and the bottom surface;
wherein said spacer is permanently attached to only one of the top and bottom surfaces;
an adhesive material configured to solely contact the top and bottom surfaces for the purpose of permanently attaching the first integrated-circuit chip to the second integrated-circuit chip.

13. The apparatus of claim 12, wherein if said spacers is permanently attached to the top surface, said bottom surface is not permanently attached to the spacer.

14. The apparatus of claim 12, wherein said spacer is a spacer ring.

15. The apparatus of claim 14, wherein said spacer ring includes a vent slot.

16. The apparatus of claim 12, further including a support substrate, wherein said first integrated-circuit chip is mounted and electrically connected to the support substrate.

17. The apparatus of claim 16, wherein said second integrated integrated-circuit chip is electrically connected to the first integrated-circuit chip.

18. The apparatus of claim 12, wherein said spacer comprises a plurality of spacing pillars.

19. A stack, comprising:
a first and a second integrated-circuit chip having opposing first and second faces;
a spacer interposed between the second face of the second chip and the first face of the first chip;
an adhesive for fastening the second face of the second chip to the first face of the first chip without the adhesive making contact to said spacer;
wherein the spacer is in direct contact with, but not attached to, one of the first and second faces and the spacer is attached to the other of the first and second faces.

20. The stack of claim 19, further comprising a further adhesive configured to attach the spacer to the other of the first and second faces.

* * * * *